March 21, 1950 M. J. PIFER 2,501,003

PUSH-BUTTON TUNING FOR SIGNAL-SEEKING RECEIVERS

Filed April 13, 1945 2 Sheets-Sheet 1

INVENTOR
Marion J. Pifer
BY C. G. Norton
ATTORNEY

March 21, 1950 M. J. PIFER 2,501,003

PUSH-BUTTON TUNING FOR SIGNAL-SEEKING RECEIVERS

Filed April 13, 1945 2 Sheets-Sheet 2

INVENTOR
Marion J. Pifer
BY C. A. Norton
ATTORNEY

UNITED STATES PATENT OFFICE 2,501,003

PUSH-BUTTON TUNING FOR SIGNAL-SEEKING RECEIVERS

Marion J. Pifer, Williamsville, N. Y., assignor to Colonial Radio Corporation, Buffalo, N. Y.

Application April 13, 1945, Serial No. 588,197

13 Claims. (Cl. 250—40)

Figure 1:
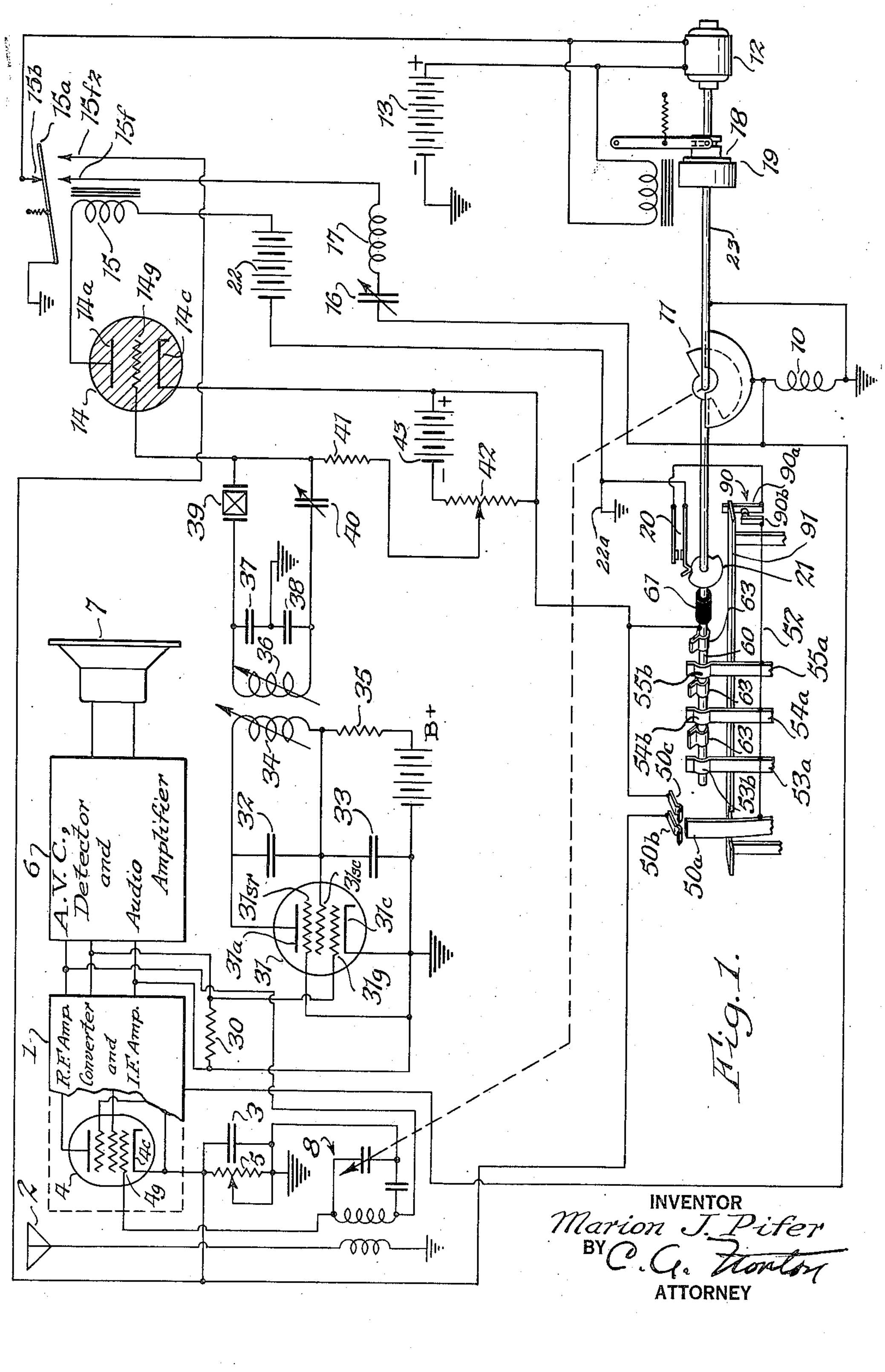

This invention relates to improvements in automatic tuning apparatus of the type in which a tuning instrumentality such as a variable condenser or inductance is operated by a motor or other power-operated mechanism and the tuning variation is stopped automatically as soon as the circuit or circuits desired to be tuned have reached resonance. Circuits of this nature are shown and described in the co-pending application of William S. Winfield, Serial No. 463,775, filed October 29, 1942, and in Bowman Patent No. 2,098,331, in which the fundamental principles of such apparatus are discussed.

The invention herein is described as applied to "signal-seeking" receivers, and more specifically, to a signal-seeking broadcast receiver such as described in the Wiley Patent No. 2,491,942 dated December 20, 1949.

In signal-seeking receivers, also sometimes called "stop-on-carrier" receivers or "signal-tuned" receivers, the tuning instrumentality is driven by a motor or other power-operated mechanism, and scans the entire frequency spectrum within the range of the receiver. When an incoming signal is tuned in, the voltage produced by the signal operates a control tube, which in turn operates a relay, opening the motor circuit so that the receiver remains tuned to the incoming signal.

A receiver so constructed and operated may at times actually receive too many stations to be convenient to operate. In a good location, and at a time when received signals are strong, stations may be picked up every 10 kc. over the broadcast band. Ordinarily the listener desires only to be able to tune local stations.

Usually the operator prefers some sort of push button selector so that, in order to receive a particular local station, all he has to do is push the button, whereupon suitable mechanism moves the tuning condenser or other tuner to a previously calibrated position at which the particular station is received. For good results, the accuracy of tuning must be better than a few hundred cycles, or the signal will be distorted.

In such apparatus the mechanism must, therefore, be very accurately set up or calibrated to insure that in subsequent operations the desired station will be properly tuned. Wear and backlash in the apparatus interfere with its proper pre-setting and proper operation, and thermal drift may also change the correct tuning setting for various stations, so that periodic resetting is usually necessary.

In accordance with this invention, a signal-seeking receiver is provided with push button tuning of an entirely new type. The receiver operates as a signal-seeking receiver for the stations which are set up for push button tuning; that is to say, the action of the received signal stops the scanning when the particular station desired is properly tuned in, but instead of stopping on the first signal it receives as heretofore, the receiver will tune only to the station indicated by the push button, if that station is on the air.

For example, if the receiver is pre-set for push button selection of certain local stations, pushing the button for a particular local station will cause the receiver to tune only to that station, passing over any others which may be picked up while tuning, and the tuning apparatus will come to rest only when stopped by the signal received from the desired local station. No signal from any other station will stop it. If that station is not on the air, the receiver will continue to scan, indicating that the desired station is not transmitting.

This is done by a series of adjustable contacts, one for each station to be pre-set, each of which operates to prevent stopping of the receiver scanning except on the frequency channel of the desired station, as will be described later, in detail.

As compared with the accuracy required of heretofore known push button tuners, the accuracy required of my push button tuner mechanism is of a different and much lower order. The push button pre-setting in my invention may be inaccurate by as much as nearly 10 kc., without interfering with the tuning operation. The desired station will still be tuned more accurately than it can be tuned manually by a skilled operator.

This push button station selection operation may be obtained without interference with the ordinary signal-seeking tuning operation, which may be provided in addition. The receiver may have a series of push buttons or plungers, called station selector plungers, to be calibrated or preset for particular local stations, and may also have a push button or plunger, called a signal-seeking plunger, which, when actuated, will cause signal-seeking operation of the conventional type.

From the foregoing it will be understood that it is an object of this invention to provide a signal-seeking receiver with push button tuning, whereby the listener who desires ordinarily to listen only to one of a small number of local stations may calibrate or pre-set the apparatus for such stations, each button being allocated to and set for a particular station.

It is a further object of this invention to provide apparatus of the class described in which the push button operation does not interfere with operation of the receiver in the conventional signal-seeking manner.

It is still a further object of this invention to provide push button control mechanism for signal-seeking receivers which is relatively simple to manufacture and install, and low in cost.

It is a further object of this invention to provide such apparatus which may be easily and quickly pre-set or calibrated by the non-technical listener to any desired station without requiring the use of tools or meters.

Still other objects and advantages of my invention will be apparent from the specification.

Figure 4:
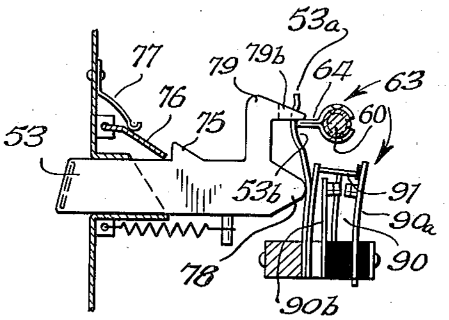
Figure 2:
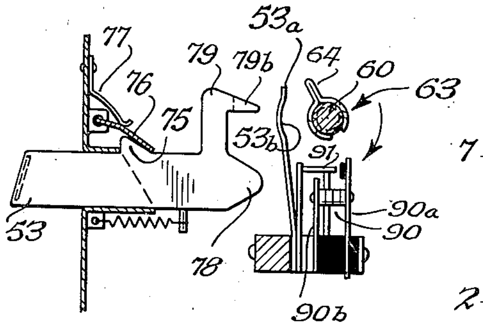
Figure 5:
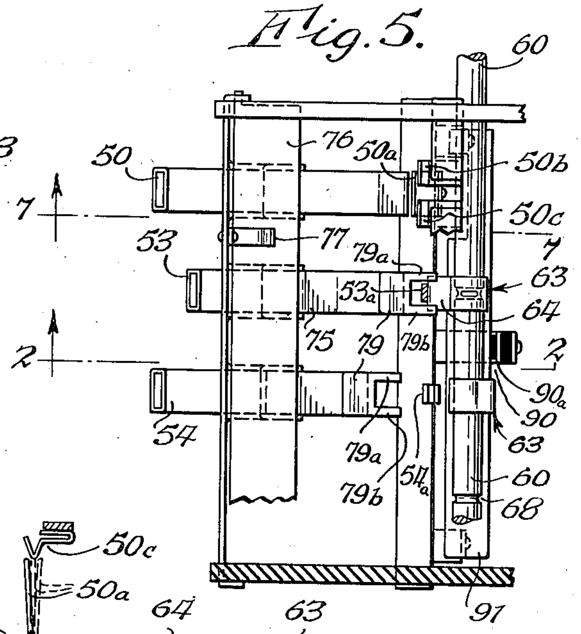
Figure 3:
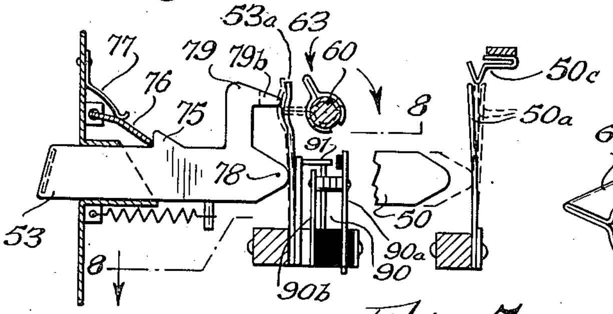
Figure 6:
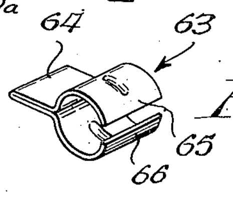
Figures 7, 8:
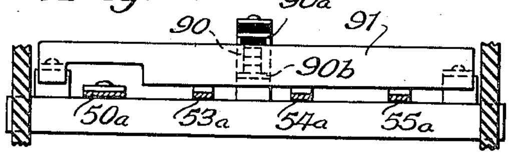

The features of novelty which I believe to be characteristic of my invention are set forth with particularity in the appended claims. My invention itself, however, both as to its fundamental principles and as to its particular embodiments, will best be understood by reference to the specification and accompanying drawing, in which Fig. 1 is a circuit diagram of so much of a radio receiver as is necessary to an understanding of my invention, Figs. 2, 3, and 4 are sectional views on lines 2—2 of Fig. 5, showing the push button mechanism in various stages of its operation, Fig. 5 is a top plan view of the push button and contact assembly, Fig. 6 is a detail perspective view of one of the shaft clips used in accordance with my invention, Fig. 7 is an enlarged detail sectional view on lines 7—7 of Fig. 5, similar to Figs. 2, 3, and 4, and showing still another position of the push button mechanism, and Fig. 8 is a detail top plan view of a portion of the apparatus shown in Fig. 5.

Referring now more particularly to Fig. 1, I have shown diagrammatically a receiver of the superheterodyne type, indicated as 1, supplied by antenna 2 feeding control electrode 4*g* of first tube 4 through tuned circuit 8 to ground. The output of the final intermediate frequency stage may be supplied to detector and audio amplifier 6 and the output thereof may operate loud speaker 7 or other suitable indicator.

Since such receivers are well known to those skilled in the art, they are not shown and described in detail. It may be noted, however, that first tube 4 may have its cathode 4*c* connected to ground through variable resistor 5, which resistor may be by-passed by condenser 3. Adjustment of the value of resistance 5 operates to control the sensitivity of the receiver, and the sensitivity is varied in accordance with my invention, in a manner which will be described hereafter.

Selection of the desired signal may be obtained by adjusting the first tuned circuit 8 and another tuned circuit, including inductance 10 and variable condenser 11, which may be connected to tube 4. In the arrangement shown, tube 4 may be the oscillator and first detector, and circuit 8 may be tuned to the incoming signal frequency while circuit 10—11 is tuned to the oscillator frequency, the circuits being ganged; but it will be understood that separate oscillator and detector tubes may be used, and additional tuned circuits may be provided, ganged with tuned circuits 8 and 10—11 and connected to the various tubes.

Also, while I have indicated variation of tuning as being obtained by rotation of variable condenser 11, it will be understood that other types of tuning may be employed, such, for instance, as permeability tuning, in which a core of magnetic material is moved into and out of inductance 10, and other types of tuning, such as the movement of a copper slug into and out of inductance 10. In the actual apparatus I prefer to employ straight line frequency tuning, although for simplicity of illustration, condenser 11 is shown as straight line capacity.

The variable tuning element or ganged elements are preferably driven by a power source, such, for instance, as motor 12 energized from source of power 13 and driving the tuning instrumentality through interposed clutch 18 and brake mechanism 19, so arranged that when the motor circuit is opened, the motor is declutched from the tuning element and the brake applied to the tuning element to insure against its coasting out of the desired tuning position.

In accordance with the signal-seeking principle, the motor and the clutch and brake mechanism are controlled by incoming signals through control tube 14 and relay 15, biased to back contact position. When relay 15 is not energized, armature 15*a* is in back contact position against back contact 15*b* and applies ground to one terminal of motor 12, the other side of which is connected through current source 13 to ground. Consequently, whenever 15 is in back contact position, the motor circuit will be energized and the motor will operate, the brake will be released, and the clutch engaged so that the receiver will continuously scan its tuning spectrum.

When an incoming signal of predetermined strength is tuned in, tube 14, which may be a thyratron, will pass plate current and relay 15 will be energized to front contact 15*f*, opening the motor circuit at 15*b*. In conventional signal-seeking receivers, this stops the variation of tuning of the receiver. In accordance with my invention herein, this may or may not stop operation of the motor and variation of the tuning, depending on whether tube 14 has been deprived of control at that particular tuning point.

If the tube 14 is deprived of control, as by having its space current circuit interrupted (as by switch 90, in a manner which will be more fully described hereafter), the tube cannot be ionized by the incoming signal, relay 15 will not be operated, and the motor will continue to run, and the tuner will continue to scan the spectrum. Just how this occurs will now be described.

Tube 14 derives its control voltage from receiver 1 through resistance 30, which may be connected across the final I. F. amplifier stage, and the voltage across resistor 30 may be impressed between cathode 31*c* and control electrode 31*g* of tube 31, which may be a pentode having in addition screen electrode 31*sc*, suppressor 31*sr*, and anode 31*a*.

Cathode 31*c* may be connected to ground and to one terminal of resistance 30. Control electrode 31*g* may be connected to the other terminal of resistance 30, and suppressor 31*sr* may be connected to cathode 31*c* and screen 31*sc* through resistance 35 to +B and thence to cathode and ground. The output of tube 31 may be passed through a transformer comprising primary winding 34 and secondary 36. Primary 34 may be connected at one end to anode 31*a* and at the other end through resistance 35 to +B.

Condenser 32 may be provided, shunting primary 34, and condenser 33, shunting resistance 35 and the +B source. Secondary 36 may be shunted by condensers 37 and 38 in series, the common point of which may be grounded, and one terminal of secondary 36 may be connected to one electrode of piezoelectric crystal 39, the other terminal of which may be connected through condenser 40 to the opposite terminal of secondary 36.

The common point of crystal 39 and condenser 40 may be connected to control electrode 14g of control tube 14, which may be a triode having cathode 14c, control electrode 14g, and anode 14a, and is preferably, although not necessarily, of the thyratron type. Control electrode 14g may be connected through resistance 41 to a variable point on resistance 42, which may be in shunt with a suitable biasing battery 43.

It will be understood that the input to tube 31 is preceded by the selector circuits provided in the R. F. amplifier, converter, and I. F. amplifier, and that these circuits have a band pass characteristic of sufficient width to accommodate the necessary side bands accompanying voice or music modulated signals of usual radio quality. As a practical matter, these circuits will have a band width usually not less than 5 kc.

The transformer 34, 36 and crystal 39 are so arranged as to be considerably sharper than this. Preferably they will have a band width which is only a small fraction of the band width of the preceding circuits. As an example, but not in limitation, I have found that very satisfactory results are obtained when the band is only 0.5 kc., and this degree of sharpness is easily obtained.

In the case of a superheterodyne, the crystal circuit is tuned exactly to the intermediate frequency and does not vary when the receiver is tuned. In the case of a T. R. F. set, the circuit must vary in its tuning with the other circuits in the receiver, a variably tuned circuit of great sharpness being substituted for the crystal.

It is desired that the receiver shall stop in response to the signal carrier wave, but not in response to noise alone; that is to say, if noise is encountered and a signal is not tuned in, the scanning must not stop. How this is accomplished will now be described. This particular feature is per se not a part of this invention, but is described and claimed in the Wiley application above mentioned, and only so much of the description is included here as is necessary to an understanding of my invention herein.

Tube 31 is operated as a limiter and is preferably adjusted so that it limits at substantially the minimum strength of desired signals; i. e., it limits below the strength of the weakest signal for which the equipment is designed.

After passing through limiter 31, the carrier will have reached the saturation level of the limiter; and since this amplitude is the upper limit of limiter 31, noise cannot increase the amplitude.

After passing through crystal 39, a significant change has occurred. There may be a loss of approximately 50% in amplitude of the wave passed through the crystal stage, and at the same time the band width has been reduced to 0.5 kc., the band width passed by the crystal.

It now becomes possible to adjust resistance 42 so that the bias voltage applied to tube 14 lies at some value at which the noise voltage alone is insufficient to overcome the bias on tube 14, whereas the signal voltage, being greater than this value, will overcome the bias, fire the tube, and stop the scanning, if the tube is in control.

At this point reference may be made to capacity 16 and inductance 17. It will be noted that when relay 15 is closed on front contact, condenser 16 and inductance 17 are connected in parallel with inductance 10 and condenser 11. This adds both capacity and inductance to the circuit and, therefore, lowers its resonant frequency.

This feature is of particular value when the design of the receiver is such that the tuning element moves an appreciable amount between the time when the signal is first tuned in and the time when the tuner element comes to rest. If this time is more than a very small amount, it may produce a frequency change in the direction of detuning, and it may, therefore, be desirable to compensate for it.

Since, for a particular piece of equipment, the detuning effect is substantially constant and may be easily measured, the proper value of inductance and/or capacity to be added for compensation may be determined without difficulty. This particular feature is per se no part of the present invention, but is described and claimed in the above-mentioned Wiley patent.

At this point it should be remembered that the signal-seeking plunger causes operation of the apparatus as a conventional signal-seeking receiver; that is, to move to the next station in the spectrum, regardless of what it may be, while each station-selector plunger causes the receiver to tune, by signal-seeking action, to the station for which the apparatus is calibrated or pre-set, for that plunger.

The construction and operation of the push button controls will now be described. A number of plungers may be provided for selection of particular stations. Ordinarily six or eight will be sufficient, but more or less may be provided, as desired. These plungers are preferably spring biased against inward movement, as is usual in push button tuners.

For simplicity of illustration, Figs. 2 to 5 and 7 show only two station-selecting plungers 53 and 54 and one signal-seeking plunger 50, and in Fig. 1, in order to simplify the explanation of the circuits and their operations, the plungers have been omitted and only the contacts operated by the plungers are shown. In Fig. 1 the contacts operated by the signal-seeking plunger and three sets of contacts for three station-selecting plungers are illustrated, it being understood that for each additional station-selecting plunger desired, an additional set of contacts will be added. Each plunger has three positions (1) fully out, (2) latched in, and (3) fully in, or overtravel.

Tuning instrumentality 11 is preferably, although not necessarily, one capable of continuous operation in the same direction, and has synchronized with it a cam switch consisting of contacts 20 operated by cam disk 21. This is preferably so related to the tuning instrumentality that switch 20 is closed only during one-half of a complete cycle of the tuning instrumentality. For instance, as herein shown, the circuits may be arranged so that the receiver tuning is terminated only as the tuning frequency rises, switch 20 being closed during the tuning half cycle when condenser 11 is decreasing in capacity, and being open in the half cycle when it is increasing.

When switch 20 is open, the space current circuit of tube 14 is interrupted at switch 20, and if for any reason the tube is passing current, it will immediately stop, and relay armature 15a will move to back contact position. Tube 14 cannot be ionized as long as switch 20 is open, and, therefore, no incoming signal can cause the tuner to stop on the return half of the cycle.

Mounted on the framework of the plunger housing (omitted from Fig. 1 for simplicity of drawing, but see Fig. 5) I may provide plunger-operated contact finger 50$a$. This is the contact operated by the signal-seeking plunger 50, and when it is operated, the receiver functions as a conventional signal-seeking receiver as previously described.

Also mounted on this framework I may provide a number of station-selecting movable contacts, herein shown as 3 in number, 53$a$, 54$a$, and 55$a$, each one corresponding to and actuated by its corresponding station-selecting plunger 53 and 54, respectively; but additional contacts and operating plungers will be provided if desired, one set for each additional station to be pre-set. All of these movable contacts may be electrically connected together in parallel by wire 52, and in series through switch 90, and switch 20 to the ground 22$a$, and also through battery or other source 22, and through relay coil 15 to the plate 14$a$ circuit of tube 14.

Cathode 14$c$ of tube 14 may be connected to extension 60 of the shaft 23 of tuning element 11, insulated therefrom by suitable insulating coupling 61, but rotating in synchronism with the shaft 23 of condenser 11. Cathode 14$c$ may also be connected to fixed contact finger 50$c$ adapted to be engaged by movable contact 50$a$. A second fixed contact finger 50$b$, adapted to be engaged by movable contact 50$a$, may be connected to the top of resistor 5.

Contact 50$b$ operates, as will be seen, to remove the sensitivity-reducing bias normally impressed on tube 4 by the current in resistance 5 and increases the sensitivity of the receiver when signal-seeking plunger 50 is operated, in order to assure full sensitivity of the receiver during such operation.

Closure of movable contact 50$a$ against fixed contact finger 50$c$, as will be observed, closes the space current path of tube 14 (from cathode 14$c$ to contact 50$c$, contact 50$a$, conductor 52, switch 90, switch 20, direct-current source 22, relay 15, to anode 14$a$) so that this tube can be ionized by incoming signals of predetermined strength when the contacts are closed. Otherwise (when the contacts are open), tube 14 is deprived of control since it cannot be ionized with an open space current circuit.

Plunger 50, when not depressed, is out of contact with finger 50$a$, which is normally biased to open position in front of fixed contacts 50$b$ and 50$c$ (full line position of Fig. 7). An allowance for overtravel is made in finger 50$a$ so that when plunger 50 is depressed to the limit of its movement, finger 50$a$ passes by contacts 50$b$ and 50$c$ to the extreme right hand dotted position in Fig. 7, and in this position finger 50$a$ does not make either 50$b$ or 50$c$.

Plunger 50 will not remain in overtravel position because of the pressure of the restoring springs operating on the plungers, and when the plunger is released, it returns to the latch position determined by cam 75 on each of the plungers engaged by pivoted latch 76 actuated by spring 77. The latch position of plunger 50 is that in which contact 50$a$ is closed against contacts 50$b$ and 50$c$ (middle position of Fig. 7).

The remaining movable contacts 53$a$, 54$a$, and 55$a$, operated by their respective plungers 53, 54, and 55, each of which is allocated to a particular station, are similarly provided with latch cam 75 and also are arranged for some overtravel, and spring contacts 53$a$, 54$a$, and 55$a$ are preferably normally slightly inclined forwardly, as shown in Fig. 2 and the dotted position in Fig. 3. Each of these plungers is provided with an operating nose which engages the respective finger at an intermediate point and moves it inwardly when the plunger is latched in.

Shaft extension 60 carries a number of wiper wings 63 corresponding to each of the movable contacts, and these may be formed by a metal clip bent at 64 to provide a pair of arcuate shaft-engaging ends 65 and 66 with circumferential depressions adapted to engage groove 68 on shaft extension 60, permitting angular displacement of the wings under certain conditions, but preventing longitudinal shifting.

In the fully out position of any particular station-selecting plunger, the corresponding movable contact is not engaged, and on rotation of shaft extension 60 each of wings 63 will pass by its corresponding contact without making it.

The zones on the various fingers where contact is made may be slightly dished, as shown (greatly exaggerated for clarity), but this is not necessary and may be omitted if desired, and the dimensions may be so chosen that each wing makes contact with its corresponding movable contact through only a small part of its 360° rotation, which will correspond to a tuning variation of a few kilocycles, preferably 5 or 6 or in any event less than 10.

When any station-selecting plunger is depressed to the latch position, the corresponding finger, such as 53$a$, is moved inwardly to the full line position shown in Fig. 3, where contact is just made by wing 63 over a small angular distance as shaft extension 60 rotates.

While any wing engages its corresponding movable contact, the space current circuit of tube 14 is completed from cathode 14$c$ to shaft extension 60 to the particular wing and its corresponding movable contact, thence through switches 90 and 20 in series through the B battery 22 and relay 15 to anode 14$a$. This contact is so slight that it does not change the angular position of the wing on the shaft extension.

Each of the plungers except plunger 50 may be provided with a second operating nose 79, having two laterally separated portions 79$a$ and 79$b$. These have no function except in overtravel position, but in such position they extend inwardly far enough to engage the outer edges of their particular wing 63, as shown in Fig. 4, and hold it against rotation while shaft extension 60 continues to rotate. This, of course, changes the angular position of the wings on the shaft extension.

It will be noted that the wings are made somewhat wider than their corresponding contacts in order that this operation may occur whenever any one of the signal-selecting position plungers 53, 54, and 55 is moved to overtravel position. Pushing any station-selecting plunger to overtravel position will open switch 90 through the action of bail 91, which engages movable arm 90$a$ of switch 90, carrying it out of contact with stationary arm 90$b$. This switch and likewise bail 91 are spring biased to the closed position of switch 90.

When this switch 90 is open, it will be seen that the space current circuit of tube 14 is interrupted, the tube will not pass current, relay armature 15$a$ will be on back contact position, the motor circuit will be completed, and the tuner will scan.

Operation of the receiver may now be understood. Suppose that it is now turned on, tuned to some particular station and the operator wishes to operate it as a signal-seeking receiver and is satisfied to receive anything which the receiver may pick up. He will then depress signal-seeking plunger 50. The first operation will be to release latch 76, allowing the previously-depressed plunger to return to "out" position.

This opens space current circuit of tube 14, relay armature 15a moves to back contact position, and the motor begins to turn. It may be noted that in pushing plunger 50, passing contact will be made by finger 50a against contacts 50b and 50c, but this will be only momentary, and by pushing the button to overtravel position the circuits controlled by these contacts are interrupted.

Thus the motor will continue to operate and the tuner will scan as long as signal-seeking plunger 50 is held in overtravel position, but the motor will be prevented from stopping as long as the button is held in this position because tube 14 cannot be ionized with its space current circuit open.

Suppose now the operator removes his finger from plunger 50. It will return to the latch position, in which finger 50a makes contact with fingers 50c and 50b, thus closing the space current circuit of tube 14, preparing the tube to fire on an incoming signal, and removing the bias on tube 4, restoring full sensitivity of the receiver.

The receiver will continue to scan until it tunes an incoming signal of predetermined strength, at which time tube 14 will fire, armature 15a will move to front contact position, opening the motor circuit and declutching the motor and the tuner, and applying the brake to the tuner and connecting in compensating circuit 16—17.

Also, ground will be applied through front contact $15f_2$ to the top of resistor 5. In this particular instance this last action is of no significance because this point is already at ground potential through closure of finger 50a against contact 50b, but it will be of significance in connection with the operation of the apparatus by any other plunger. If the operator is not satisfied with the station thus tuned in, it is only necessary to push plunger 50 momentarily again, and the receiver will tune to the next station in the spectrum in the manner just described.

Suppose, however, that the operator now depresses plunger 53, corresponding to a particular local station for which the apparatus has already been pre-set or calibrated. The first operation of plunger 53 will be to release latch 76, thus restoring any other depressed plunger to "out" position, and opening the plate circuit of tube 14, which starts the tuner scanning.

The operator may now remove his finger from plunger 53, which is held in latched-in position, holding finger 53a in depressed position where it will be engaged by the corresponding wing 63 at some point during its revolution. It will be noted that the space current circuit of tube 14 is now open through all of the wings, none of which are in contact with their respective fingers, and it is also open at contact 50c, which is no longer engaged by finger 50a.

Consequently, tube 14 will be deionized, relay armature 15a will be in back contact position, and the motor circuit will be established at 15b. The tuner will scan, and nothing further will occur until it comes to within a few kilocycles of the particular frequency channel on which the desired local station is operating.

At this time it should be noted that the short-circuit around resistor 5 has been opened at $15f_2$, and the sensitivity of the receiver is reduced so that only strong signals are being brought in. This eliminates the possibility of the receiver tuning being terminated by a distant station in the neighborhood of the frequency of the desired local station.

As soon as wing 63 engages its finger 53a, the space current circuit of tube 14 is completed and this tube can now be ionized. Since the next station which will be received on further operation of the tuner is the desired station, scanning will continue until the desired signal is tuned in, in response to which tube 14 will ionize and close relay 15 on front contact, stopping the motor, applying the circuit compensation, and restoring full sensitvity to the receiver by short-circuiting resistor 5 through contact $15f_2$, permitting the receiver to operate at full sensitivity under the control of any well-known A. V. C. circuit (not shown).

If the operator now wishes to change to another local station, he may, for instance, operate plunger 54. This will, as before, release any other plungers, open the space current circuit of tube 14, start the tuner in operation, and also reduces the sensitivity of the receiver. The tuner will continue to operate until the next wing 63 engages its corresponding finger 54a, at which time the same kind of operation occurs and the receiver tuning will be terminated at the newly selected station.

It may be noted that failure of the receiver to tune to the desired station frequency indicates that the selected station is not operating, and this affords a ready means of determining whether the desired station is on the air, as, for example, late at night.

It now remains only to describe how the receiver is preset or calibrated for particular local stations. In order to do this, the operator must know the frequency on which the desired station operates, which he will determine from any log book or from the daily newspaper programs.

Having decide, for example, that plunger 53 is to be allocated to station A, he then pushes plunger 53 into the overtravel position shown in Fig. 4 and holds it there. This releases all other plungers, opens the plate circuit of tube 14 at switch 90, reduces the sensitivity of the receiver, and starts the tuner. He will continue to hold the plunger in the overtravel position until the dial shows him that he is within a few kilocycles of this station, at which time wing 63, corresponding to finger 53a, has been engaged by nose 79a and 79b of the plunger and it has been shifted angularly on the extension of shaft of tuner 11.

He will then release plunger 53, which moves out from overtravel position to latch position, permitting wing 63 to rotate with shaft extension 60, but before this wing breaks contact with finger 53a, the desired station will be received, tube 14 will fire, and the receiver tuning will be terminated with the desired station tuned in and with wing 63 in the proper or pre-set angular position for future tuning of the same station by the same plunger. The other plungers may be set in a similar manner and the receiver is then calibrated or preset for the particular local stations desired.

It is clear that this presetting or calibration operation can best be performed in the manner described when the particular desired stations are on the air, as otherwise the tuner will simply continue to scan. However, in this connection it may be pointed out that, although the receiver tuning will not be terminated because the desired station is not on the air, if the operation has been carried out correctly and the plunger released when the receiver is not more than 10 kc. away from the desired station and the tuning is approaching it, the apparatus is correctly calibrated, and when next this particular plunger is operated and the station is on the air, the receiver will accurately tune to it.

If at any time it is desired to reset for different stations, this is done just as already described; and if thermal drift should cause the set to go out of tune slightly after being in operation a while, it is only necessary to press another button momentarily to start the scanning, then press the desired station button again. The receiver tuning will then go through the tuning cycle and stop on the station desired, at the correct tuning position, since it is reception of the signal which determines the stopping position.

While I have shown and described certain preferred embodiments of my invention, it will be understood that modifications and changes may be made without departing from the spirit and scope thereof, as will be clear to those skilled in the art.

In the specification I have explained the principles of my invention and the best mode in which I have contemplated applying those principles, so as to distinguish my invention from other inventions, and I have particularly pointed out and distinctly claimed the part, improvement, or combination which I claim as my invention or discovery.

I claim:

1. In a signal-seeking receiver, in combination, a power-operated tuner for scanning the spectrum of said receiver, and a control circuit, including a thermionic tube for stopping variation of said tuner in response to reception of a signal of predetermined strength, said control circuit being normally de-activated, said tube having its circuits so arranged that variation of said tuner is initiated whenever said control circuit is deactivated, a plurality of station-selecting plungers, and a plurality of switch elements each operated by one of said station-selecting plungers to effect activation of said control circuit over a predetermined small portion of the scanning spectrum, each switch element including a portion thereof synchronized with said tuner for de-activating said control circuit and thereafter reestablishing it once in each tuning cycle over said predetermined small portion of the frequency spectrum scanned by said tuner, said last mentioned switch portions comprising spring clips angularly adjustable on a shaft synchronized with said tuner.

2. The combination claimed in claim 1, in which said plungers are movable into the path of said spring clips to adjust them angularly on said shaft.

3. The combination claimed in claim 1, in which said plungers have a switch-closing position and an overdrive position, in the latter of which they project into the path of said spring clips to cause angular adjustment thereof.

4. The combination claimed in claim 1, in which said plungers have a signal-selecting position and an overdrive position, and which includes a switch in the space current circuit of said tube, and means operated by any of said plungers in overdrive position for opening said switch.

5. A signal-seeking receiver comprising: variable means for tuning said receiver to any frequency within a predetermined operating frequency range; power-operated means energizable to vary said tuning means continuously and repeatedly over said tuning range; a control system having an energizing circuit and responsive to a predetermined amplitude of a wave signal translated by said receiver for deenergizing said power-operated means to terminate variation thereby of said tuning means; and a plurality of station selectors included in said energizing circuit and each comprising switch elements selectably actuated, in synchronized relation with the movement of said tuning means, to circuit-opening position at which said control system is deenergized over the major portion of said tuning range and to circuit-closing position at which said control system is energized over a preselected small portion of said tuning range to permit said control system over said small portion of said tuning range to effect said deenergization of said power-operated means.

6. A signal-seeking receiver comprising: variable means for tuning said receiver to any frequency within a predetermined operating frequency range; power-operated means energizable to vary said tuning means continuously and repeatedly over said tuning range; a control system having an energizing circuit and responsive to a predetermined amplitude of a wave signal translated by said receiver for deenergizing said power-operated means to terminate variation thereby of said tuning means; a plurality of station selectors included in said energizing circuit and individually movable from an inoperative to an operative position; each of said selectors comprising switch elements selectively actuated, in synchronized relation with the movement of said tuning means, to circuit-opening position at which said control system is deenergized over the major portion of said tuning range and to circuit-closing position at which said control system is energized over a preselected small portion of said tuning range to permit said control system over said small portion of said tuning range to effect said deenergization of said power-operated means; and a plurality of actuators for selectively moving said selectors to said operative position thereof to select an individual small portion of said tuning range within which to permit said deenergization of said power-operated means.

7. A signal-seeking receiver comprising: variable means for tuning said receiver to any frequency within a predetermined operating frequency range; power-operated means energizable to vary said tuning means continuously and repeatedly over said tuning range; a control system having an energizing circuit and responsive to a predetermined amplitude of a wave signal translated by said receiver for deenergizing said power-operated means to terminate variation thereby of said tuning means; a plurality of station selectors included in said energizing circuit and each comprising switch elements selectably actuated, in synchronized relation with the movement of said tuning means, to circuit-opening position at which said control system is deenergized over the major portion of said tuning range and to circuit-closing position at which said control system is energized over a preselected small portion of said tuning range to permit said control system over said small portion of said tuning range to effect said deenergization of said power-operated means; and means for adjustably presetting said synchronized relation of said each switch elements and said tuning means to adjust the positions of said small portions within said tuning range.

8. A signal-seeking receiver comprising: variable means for tuning said receiver to any frequency within a predetermined operating frequency range; power-operated means energizable to vary said tuning means continuously and repeatedly over said tuning range; a control system having an energizing circuit and responsive to a predetermined amplitude of a wave signal translated by said receiver for deenergizing said power-operated means to terminate variation thereby of said tuning means; a plurality of station selectors included in said energizing circuit and individually movable from an inoperative to an operative position; each of said selectors comprising switch elements selectably actuated, in synchronized relation with the movement of said tuning means, to circuit-opening position at which said control system is deenergized over the major portion of said tuning range and to circuit-closing position at which said control system is energized over a preselected small portion of said tuning range to permit said control system over said small portion of said tuning range to effect said deenergization of said power-operated means; and a plurality of actuators for selectively moving said selectors to said operative position thereof to select an individual small portion of said tuning range within which to permit said deenergization of said power-operated means; each of said actuators being movable to an overdrive position and including means effective in said overdrive position for adjustably presetting said synchronized relation of said each switch elements and said tuning means to adjust the positions of said small portions within said tuning range.

9. A signal-seeking receiver comprising: variable means for tuning said receiver to any frequency within a predetermined operating frequency range; power-operated means energizable to vary said tuning means continuously and repeatedly over said tuning range; a control system having an energizing circuit and responsive to a predetermined amplitude of a wave signal translated by said receiver for deenergizing said power-operated means to terminate variation thereby of said tuning means; a plurality of pairs of switch elements actuated in synchronized relation with said tuning means to a circuit-opening position at which said control system is deenergized over the major portion of said tuning range and to a circuit-closing position at which said control system is energized over a preselected small portion of said tuning range; and a plurality of station selectors for selectively including individual pairs of said switch elements in said energizing circuit of said control system to permit said control system over said small tuning range portion of a selected pair of switch elements to effect said deenergization of said power-operated means.

10. A signal-seeking receiver comprising, variable means for tuning said receiver to any frequency within a predetermined operating frequency range; power-operated means energizable to vary said tuning means continuously and repeatedly over said tuning range; a control system having an energizing circuit and responsive to a predetermined amplitude of a wave signal translated by said receiver for deenergizing said power-operated means to terminate variation thereby of said tuning means; a plurality of switches each including a first relatively fixed switch element and a second switch element movable in synchronized relation with said tuning means to provide a circuit-opening position of said each switch over the major portion of said tuning range and a circuit-closing position thereof over a preselected small portion of said tuning range; and a plurality of station selectors for selectively including individual ones of said switches in said energizing circuit of said control system to permit said control system over said small tuning range portion of a selected switch to effect said deenergization of said power-operated means.

11. A signal-seeking receiver comprising, variable means for tuning said receiver to any frequency within a predetermined operating frequency range; power-operated means energizable to vary said tuning means continuously and repeatedly over said tuning range; a control system having an energizing circuit and responsive to a predetermined amplitude of a wave signal translated by said receiver for deenergizing said power-operated means to terminate variation thereby of said tuning means; a plurality of switches each including a first relatively fixed switch element and a second switch element movable in synchronized relation with said tuning means to provide a circuit-opening position of said each switch over the major portion of said tuning range and a circuit-closing position thereof over a preselected small portion of said tuning range; and a plurality of station selectors for selectively including individual ones of said switches in said energizing circuit of said control system to permit said control system over said small tuning range portion of a selected switch to effect said deenergization of said power-operated means; each of said station selectors including means operated thereby for adjustably presetting the synchronized relation of an individual one of said second switch elements and said tuning means to adjust the positions of said small portions within said tuning range.

12. A signal-seeking receiver comprising: variable means for tuning said receiver to any frequency within a predetermined operating frequency range; power-operated means energizable to vary said tuning means continuously and repeatedly over said tuning range; a control system having an energizing circuit and responsive to a predetermined amplitude of a wave signal translated by said receiver for deenergizing said power-operated means to terminate variation thereby of said tuning means; a plurality of switches included in said energizing circuit to energize said control system upon closure of each switch, each of said switches having a first switch element rotatable with said tuning means and a second switch element normally positioned out of engagement with said first switch element but movable into the path of travel thereof to make contact therewith only over a preselected small portion of said tuning range; and a plurality of station selectors for selectively moving individual ones of said second switch elements into the path of travel of an associated first switch element to permit said control system over said small portions of said tuning range to effect said deenergization of said power-operated means.

13. A signal-seeking receiver comprising: variable means for tuning said receiver to any frequency within a predetermined operating frequency range; power-operated means energizable to vary said tuning means continuously and repeatedly over said tuning range; a control system having an energizing circuit and responsive to a predetermined amplitude of a wave signal translated by said receiver for deenergizing said power-operated means to terminate variation thereby of said tuning means; a plurality of normally open switches included in said energizing circuit to energize said control system upon closure of any one of said switches and thereby permit said control system to effect deenergization of said power-operated means; each of said switches having a first switch element moving, in synchronized relation with the movement of said tuning means, out of engagement with a second switch element over the major portion of said tuning range but movable into engagement with said second switch element over a preselected small portion of said tuning range; said second switch element of each switch being selectively movable from a first position at which said each switch is open for all positions of said first switch element to a second position at which said each switch is closed over said preselectable small portion of said tuning range; and a plurality of station selectors for selectively moving individual ones of said second switch elements to said second position thereof to effect tuning of said receiver to preselected received wave signals within said range.

MARION J. PIFER.

REFERENCES CITED

The following references are of record in the file of this patent:

UNITED STATES PATENTS

| Number | Name | Date |
|---|---|---|
| 2,056,200 | Lowell | Oct. 6, 1936 |
| 2,174,634 | Lesti | Oct. 3, 1939 |
| 2,182,352 | Prochnow | Dec. 5, 1939 |
| 2,186,823 | De Tar | Jan. 9, 1940 |
| 2,210,425 | Newman | Aug. 6, 1940 |
| 2,231,806 | Goldsborough | Feb. 11, 1941 |
| 2,262,218 | Andrews | Nov. 11, 1941 |
| 2,275,650 | Porter et al. | Mar. 10, 1942 |
| 2,304,871 | Andrews | Dec. 15, 1942 |
| 2,326,737 | Andrews | Aug. 17, 1943 |
| 2,394,869 | Nicholson | Feb. 12, 1946 |